US007902065B2

(12) United States Patent
Kim et al.

(10) Patent No.: US 7,902,065 B2
(45) Date of Patent: Mar. 8, 2011

(54) MULTI-LAYERED METAL LINE HAVING AN IMPROVED DIFFUSION BARRIER OF A SEMICONDUCTOR DEVICE AND METHOD FOR FORMING THE SAME

(75) Inventors: Baek Mann Kim, Gyeonggi-do (KR); Seung Jin Yeom, Gyeonggi-do (KR); Young Jin Lee, Gyeonggi-do (KR); Dong Ha Jung, Gyeonggi-do (KR); Jeong Tae Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 270 days.

(21) Appl. No.: 11/939,798

(22) Filed: Nov. 14, 2007

(65) Prior Publication Data

US 2009/0001579 A1 Jan. 1, 2009

(30) Foreign Application Priority Data

Jun. 26, 2007 (KR) .................. 10-2007-0063255

(51) Int. Cl.
  *H01L 21/00* (2006.01)
(52) U.S. Cl. .................. 438/636; 257/E21.168
(58) Field of Classification Search .......... 257/650–670, 257/E21.168–E21.169; 438/688, 685, 656, 438/654, 653
  See application file for complete search history.

(56) References Cited

U.S. PATENT DOCUMENTS

| | | | | |
|---|---|---|---|---|
| 6,350,685 B1 * | 2/2002 | Asahina et al. | ............... | 438/660 |
| 6,627,995 B2 * | 9/2003 | Relja et al. | ............... | 257/750 |
| 6,808,976 B1 * | 10/2004 | Agarwal | ............... | 438/238 |
| 7,160,802 B2 * | 1/2007 | Nguyen et al. | ............... | 438/648 |
| 2003/0157760 A1 * | 8/2003 | Xi et al. | ............... | 438/200 |
| 2003/0203616 A1 * | 10/2003 | Chung et al. | ............... | 438/627 |
| 2003/0224217 A1 * | 12/2003 | Byun et al. | ............... | 428/698 |
| 2005/0009325 A1 | 1/2005 | Chung et al. | | |
| 2006/0170103 A1 * | 8/2006 | Suh et al. | ............... | 257/751 |
| 2006/0270177 A1 * | 11/2006 | Park et al. | ............... | 438/386 |

FOREIGN PATENT DOCUMENTS

| | | |
|---|---|---|
| KR | 100243286 | 11/1999 |
| KR | 10-0255130 B1 | 2/2000 |
| KR | 10-0753422 B1 | 8/2007 |

OTHER PUBLICATIONS

M. Guziewicz, Characteristics of sputter-deposited TiN, ZrB2 and W2B diffusion barriers for advanced metallization to GaAs, Jan. 21, 1999, Solid-State Electronics 43(1999) 1055-1061.*
Park et al (Journal of electrochemical society, 154 (8) D435-D441, (2007)).*

* cited by examiner

*Primary Examiner* — Matthew W Such
*Assistant Examiner* — Ali Naraghi
(74) *Attorney, Agent, or Firm* — Ladas & Parry LLP

(57) ABSTRACT

A multi-layered metal line of a semiconductor device and a process of forming the same are described. The multi-layered metal line includes a lower metal line formed on a semiconductor substrate. An insulation layer is subsequently formed on the semiconductor substrate including the lower metal line and has an upper metal line forming region that exposes a portion of the lower metal line. A diffusion barrier formed on a surface of the upper metal line forming region of the insulation layer. The diffusion barrier includes a W—B—N ternary layer. An upper metal line is finally formed on the diffusion barrier to fill the upper metal line forming region of the insulation layer.

6 Claims, 4 Drawing Sheets

MULTI-LAYERED METAL LINE HAVING AN IMPROVED DIFFUSION BARRIER OF A SEMICONDUCTOR DEVICE AND METHOD FOR FORMING THE SAME

CROSS-REFERENCE TO RELATED APPLICATIONS

The present application claims priority to Korean patent application number 10-2007-0063255 filed on Jun. 26, 2007, which is incorporated herein by reference in its entirety.

BACKGROUND OF THE INVENTION

The present invention relates to a multi-layered metal line of a semiconductor device and a method for forming the same, and more particularly, to a multi-layered metal line of a semiconductor device that can improve the characteristics of a diffusion barrier and thereby improve the characteristics and reliability of a semiconductor device and a method for forming the same.

Generally, in a semiconductor device, metal lines are formed to electrically connect elements or lines with each other. Contact plugs are formed to connect lower metal lines and upper metal lines with each other. As a design rule decreases to conform to the trend toward high integration of a semiconductor device, the aspect ratio of a contact hole in which a contact plug is formed gradually increases. As a result, the difficulty and importance of a process for forming the metal line and the contact plug has been noted.

Aluminum (Al) and tungsten (W) have been mainly used as a material for the metal line of a semiconductor device since they have good electrical conductivity. Recently, research has been made for using copper (Cu) as a next-generation material for a metal line due to copper having excellent electrical conductivity and low resistance when compared to aluminum and tungsten. Copper can therefore solve the problems associated with RC signal delay in the semiconductor device having a high level of integration and high operating speed.

Since copper cannot be easily dry-etched into a wiring pattern, a damascene process is employed to form a metal line using copper. In the damascene process, a metal line is formed such that after etching an interlayer dielectric and thereby defining a damascene pattern, a metal layer, i.e., a copper layer is filled in the damascene pattern.

The damascene pattern is formed through a single damascene process or a dual damascene process. Where applying the dual damascene process, an upper metal line and a contact plug for connecting the upper metal line and a lower metal line can be simultaneously formed. Since surface undulations that are produced due to the presence of the metal line can be removed, a subsequent process can be conveniently conducted.

When forming a multi-layered metal line using the damascene process, where copper is used as the material for a lower metal line and aluminum is used as the material for an upper metal line, as different metals are joined with each other, a high resistance compound may be produced due to diffusion of the respective metals. Therefore, in order to prevent the high resistance compound from being produced, a diffusion barrier must be formed on the interface of the lower metal line made of a copper layer and the upper metal line made of an aluminum layer. Generally, a Ti layer, a TiN layer, a Ta layer or a TaN layer is used as the diffusion barrier.

In the conventional art as described above, the diffusion barrier must have a sufficient thickness to stably perform its function. Although it is possible to prevent the high resistance compound from being produced between the metal lines if the diffusion barrier has a sufficient thickness, as the proportion of the aluminum layer decreases, contact resistance cannot be decreased sufficiently.

Conversely, the thickness of the diffusion barrier may be reduced to improve the decrease in the contact resistance. However, due to the diffusion of aluminum as the material of the upper metal line, voids can be formed in the aluminum layer and a high resistance compound is likely produced. As a result, the contact resistance can be increased and the semiconductor device characteristics and reliability can deteriorate.

SUMMARY OF THE INVENTION

Embodiments of the present invention are directed to a multi-layered metal line of a semiconductor device that can improve the characteristics of a diffusion barrier and a method for forming the same.

Embodiments of the present invention are also directed to a multi-layered metal line of a semiconductor device that can improve the characteristics and reliability of a semiconductor device and a method for forming the same.

In one aspect, a multi-layered metal line of a semiconductor device comprises a lower metal line formed on a semiconductor substrate; an insulation layer formed on the semiconductor substrate including the lower metal line having an upper metal line forming region exposing at least a portion of the lower metal line; a diffusion barrier including a W—B—N ternary layer formed on a surface of the upper metal line forming region of the insulation layer; and an upper metal line formed on the diffusion barrier to fill the upper metal line forming region of the insulation layer.

The lower metal line includes a copper layer, and the upper metal line includes an aluminum layer.

The diffusion barrier has a thickness of 10~500 Å.

The multi-layered metal line further comprises a wetting layer containing $W_2B$ interposed between the diffusion barrier and the upper metal line.

The wetting layer has a thickness of 10~1,000 Å.

The wetting layer includes a $W_2B$ layer containing 20~40 atom % of boron.

In another aspect, a method for forming a multi-layered metal line of a semiconductor device comprises the steps of forming a lower metal line on a semiconductor substrate; forming an insulation layer on the semiconductor substrate including the lower metal line having an upper metal line forming region exposing at least a portion of the lower metal line; forming a diffusion barrier including a W—B—N ternary layer on the insulation layer including a surface of the upper metal line forming region; and forming an upper metal line on the diffusion barrier to fill the upper metal line forming region.

The lower metal line includes a copper layer, and the upper metal line includes an aluminum layer.

The diffusion barrier is formed by introducing boron into a thin $WN_x$ layer.

Boron is introduced using boron-based gas through heat treatment or plasma treatment.

$B_2H_6$ is used as the boron-based gas.

The diffusion barrier is formed by introducing nitrogen into a thin $WB_x$ layer.

Nitrogen is introduced using nitrogen-based gas through heat treatment or plasma treatment.

$N_2$ or $NH_3$ is used as the nitrogen-based gas.

The diffusion barrier is formed through ALD using $WF_6$, $B_2H_6$ and $NH_3$.

The diffusion barrier is formed to have a thickness of 10~500 Å.

The method further comprises the step of forming a wetting layer containing $W_2B$ on the diffusion barrier after the step of forming the diffusion barrier and before the step of forming the upper metal line.

The wetting layer is formed through CVD or ALD using $WF_6$ and $B_2H_6$ gas.

The wetting layer is formed as a $W_2B$ layer containing 20~40 atom % of boron.

The wetting layer is formed to have a thickness of 10~1,000 Å.

DESCRIPTION OF SPECIFIC EMBODIMENTS

In the present invention, when copper and aluminum are respectively used as the materials of a lower metal line and an upper metal line, a W—B—N ternary layer is formed as a diffusion barrier through CVD (chemical vapor deposition) or ALD (atomic layer deposition) on the interface of the lower metal line and the upper metal line. Further, in the present invention, a wetting layer including a $W_2B$ layer is formed through CVD on the diffusion barrier including the W—B—N ternary layer.

In this case, unlike conventional diffusion barriers made of a Ti layer or a TiN layer through sputtering, the characteristics of the diffusion barrier can be improved since the W—B—N ternary layer is formed as the diffusion barrier through CVD or ALD having an excellent step coverage quality. Accordingly, in the present invention, it is possible to prevent voids from being formed in an aluminum layer due to diffusion of aluminum as the material of the upper metal line. Therefore, it is possible to improve the characteristics and reliability of a semiconductor device by preventing the contact resistance from increasing.

Also, in the present invention, when forming the upper metal line using aluminum, the process can be stably and easily implemented because the $W_2B$ layer having low specific resistance is formed as the wetting layer on the diffusion barrier including the W—B—N ternary layer.

Hereafter, specific embodiments of the present invention will be described in detail with reference to the attached drawings.

Figure 1:
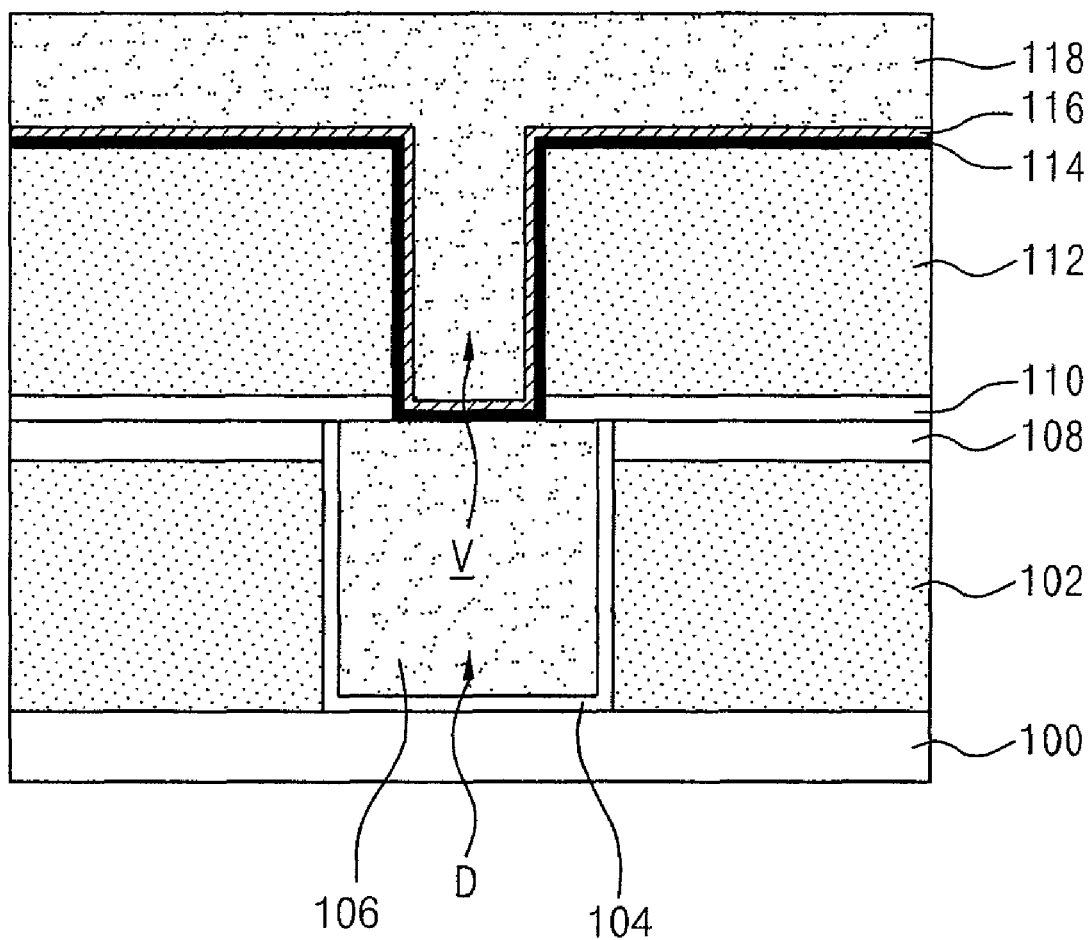
FIG. 1 is a cross-sectional view illustrating a multi-layered metal line of a semiconductor device in accordance with an embodiment of the present invention.

FIG. 1 is a cross-sectional view illustrating a multi-layered metal line of a semiconductor device in accordance with an embodiment of the present invention.

Referring to FIG. 1, an interlayer dielectric 102 and a polish stop layer 108 are sequentially formed on a semiconductor substrate 100. A first metal line forming region D, in which a lower metal line is to be formed, is defined in the polish stop layer 108 and the interlayer dielectric 102. A lower metal line 106 is formed in the first metal line forming region D. The lower metal line 106 includes a copper layer. An etch stop layer 110 and an insulation layer 112 are sequentially formed on the polish stop layer 108 including the lower metal line 106. A second metal line forming region V is defined in the insulation layer 112 and the etch stop layer 110. An upper metal line 118 is formed on the insulation layer 112 including the second metal line forming region V. The upper metal line 118 includes an aluminum layer.

A diffusion barrier 114 including a W—B—N ternary layer is formed on the surface of the insulation layer 112 including the second metal line forming region V on which the upper metal line 118 is formed. Also, a wetting layer 116 containing $W_2B$ is formed on the diffusion barrier 114. The diffusion barrier 114 and the wetting layer 116 are formed to have thicknesses of 10~500 Å and 10~1,000 Å, respectively. The wetting layer 116 is formed to contain 20~40 atom % of boron (B).

The first metal line forming region D, in which the lower metal line 106 is formed, is defined by a single damascene process or a dual damascene process. The first metal line forming region D is formed to have a trench structure or a trench and via hole structure including a trench and at least one via hole communicating with the trench. The second metal line forming region V, in which the upper metal line 118 is formed, is formed as a via hole structure.

In FIG. 1, unexplained reference numeral 104 designates a TaN/Ta layer.

In the multi-layered metal line according to the present invention, the characteristics of a diffusion barrier are improved since the diffusion barrier, including a W—B—N ternary layer, is formed on the interface of a lower metal line and an upper metal line. Accordingly, in the present invention, it is possible to prevent voids due to diffusion of aluminum as the material of the upper metal line from being formed in the upper metal line. It is also possible to prevent a high resistance compound from being produced in the interface of the lower metal line and the upper metal line. As a result, in the present invention, it is possible to improve the characteristics and reliability of a semiconductor device by preventing contact resistance between the lower metal line and the upper metal line from increasing.

Also, in the present invention, the process for forming the upper metal line can be stably and easily implemented since a $W_2B$ layer having low specific resistance is formed on the diffusion barrier as a wetting layer.

FIGS. 2A through 2F are cross-sectional views illustrating the processes of a method for forming a multi-layered metal line of a semiconductor device in accordance with another embodiment of the present invention. The method will be described below in detail.

Figure 2A:
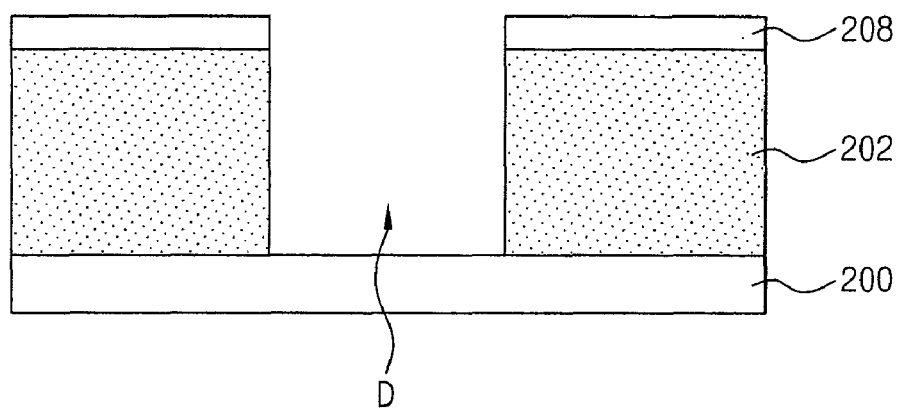
FIGS. 2A through 2F are cross-sectional views illustrating the processes of a method for forming a multi-layered metal line of a semiconductor device in accordance with another embodiment of the present invention.

Referring to FIG. 2A, an interlayer dielectric 202 is formed on a semiconductor substrate 200 to cover a lower structure of the semiconductor substrate 200 (not shown) including gate lines and bit lines. A polish stop layer 208 is formed on the interlayer dielectric 202. By etching the polish stop layer 208 and the interlayer dielectric 202, a first metal line forming region D is defined in which a lower metal line is to be formed. The first metal line forming region D can be defined to have a single structure including a trench or a dual structure including a trench and a via hole.

Figure 2B:
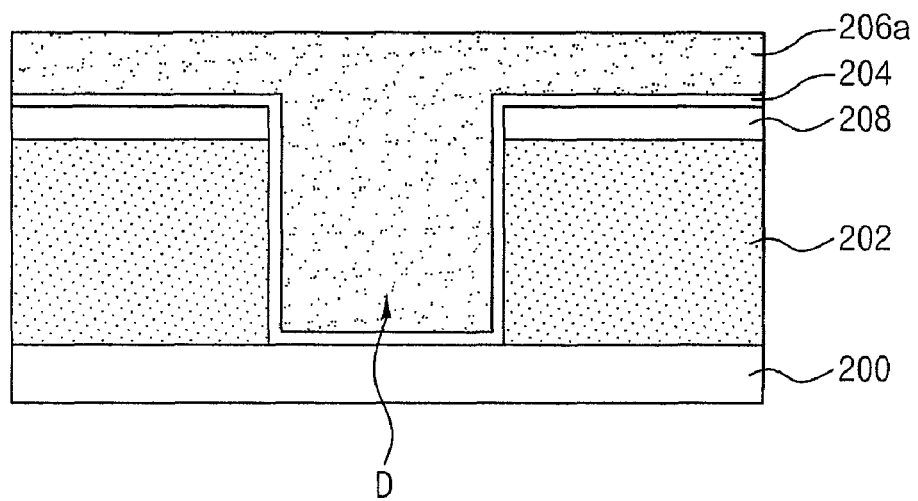

Referring to FIG. 2B, a TaN/Ta layer 204 is formed as a layer for preventing diffusion of copper on the surfaces of the first metal line forming region D and the polish stop layer 208. A seed layer (not shown) for ensuring filling of a metal layer is formed on the TaN/Ta layer 204. Then, a metal layer 206a for a lower metal line is formed on the seed layer to fill the first metal line forming region D, i.e., a damascene pattern. The metal layer 206a for a lower metal line is formed through electroplating and includes a copper layer.

Figure 2C:
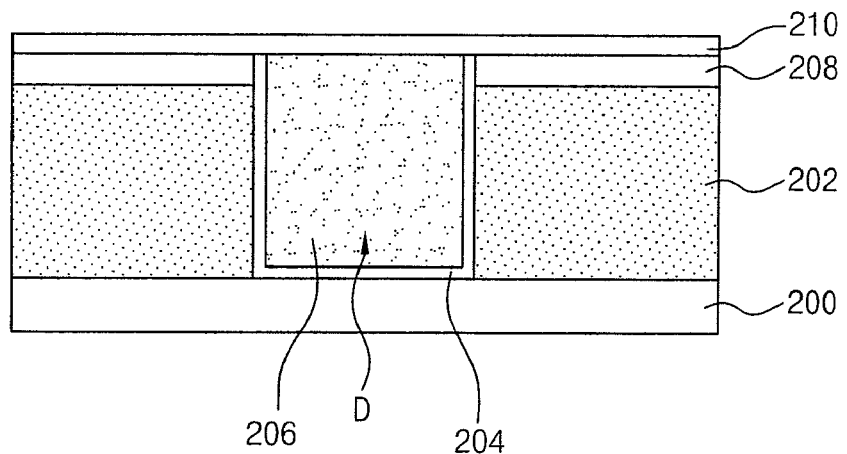

Referring to FIG. 2C, the metal layer 206a for a lower metal line and the TaN/Ta layer 204 are removed through chemical and mechanical polishing ("CMPing") until the polish stop layer 208 is exposed thereby forming a lower metal line 206. An etch stop layer 210 is formed on the lower metal line 206 including the TaN/Ta layer 204 and the polish stop layer 208.

Figure 2D:
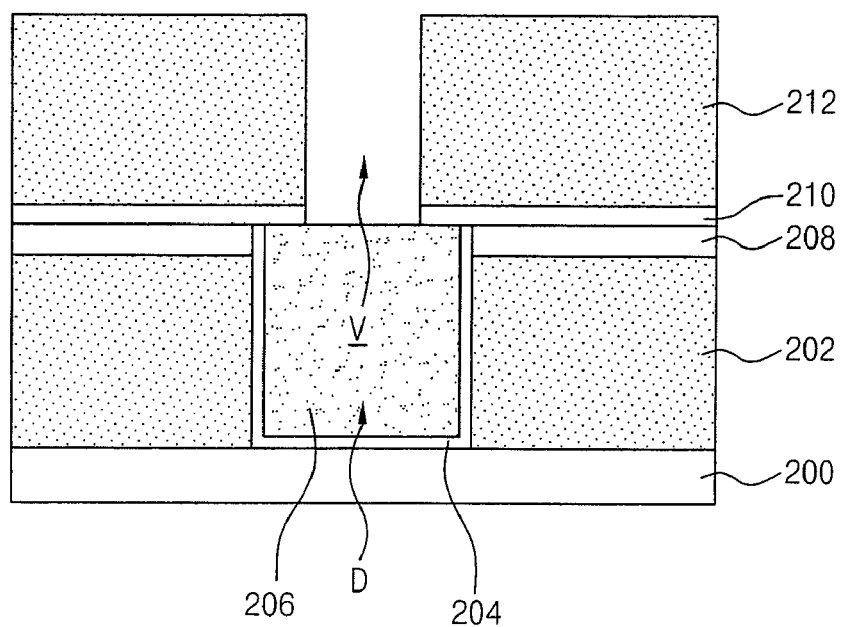

Referring to FIG. 2D, an insulation layer 212 is formed on the etch stop layer 210. A second metal line forming region V is defined by etching the insulation layer 212 and the etch stop layer 210 until the lower metal line 206 is exposed. Preferably, the second metal line forming region V has a via hole structure.

Figure 2E:
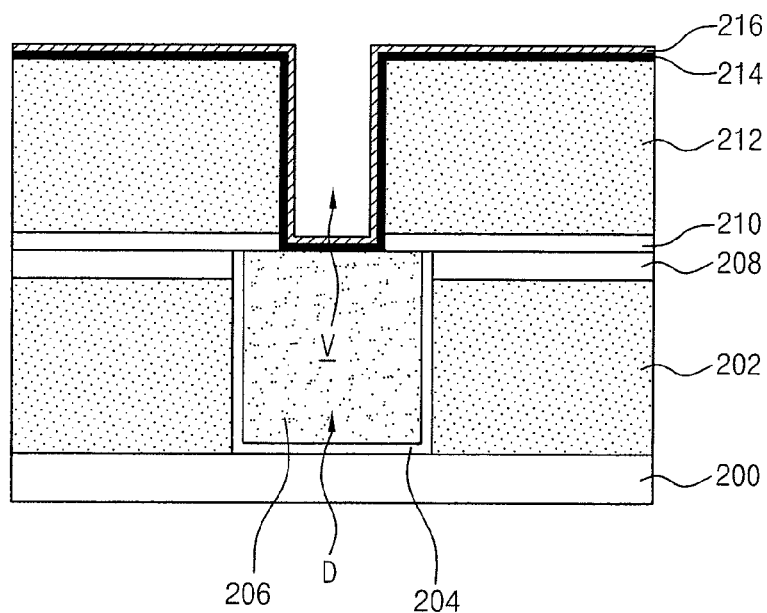

Referring to FIG. 2E, a diffusion barrier 214 and a wetting layer 216 are sequentially formed on the insulation layer 212 including the second metal line forming region V to have thicknesses of 10~500 Å and 10~1,000 Å, respectively. The diffusion barrier 214 can be formed in three ways as described below.

First, the diffusion barrier 214 can be formed through introducing boron into a thin $WN_x$ layer. The thin $WN_x$ layer is formed through PVD (physical vapor deposition), CVD or ALD. In the thin $WN_x$ layer, x has a range of 0.3~3.0. Boron is a boron-based gas such as $B_2H_6$ and introduced into the thin $WN_x$ layer through heat treatment or plasma treatment. Second, the diffusion barrier 214 can be formed through introducing nitrogen into a thin $WB_x$ layer. The thin $WB_x$ layer is formed through PVD, CVD or ALD. In the thin $WB_x$ layer, x has a range of 0.3~3.0. Nitrogen is a nitrogen-based gas such as $N_2$ and $NH_3$ and introduced into the thin $WB_x$ layer through heat treatment or plasma treatment. Third, the diffusion barrier 214 can be formed using $WF_6$, $B_2H_6$ and $NH_3$ through ALD.

The wetting layer 216 is formed through CVD or ALD. When using CVD or ALD, it is preferable to use $WF_6$ and $B_2H_6$ gas. The wetting layer 216 is formed to contain 20~40 atom % of boron.

Figure 2F:
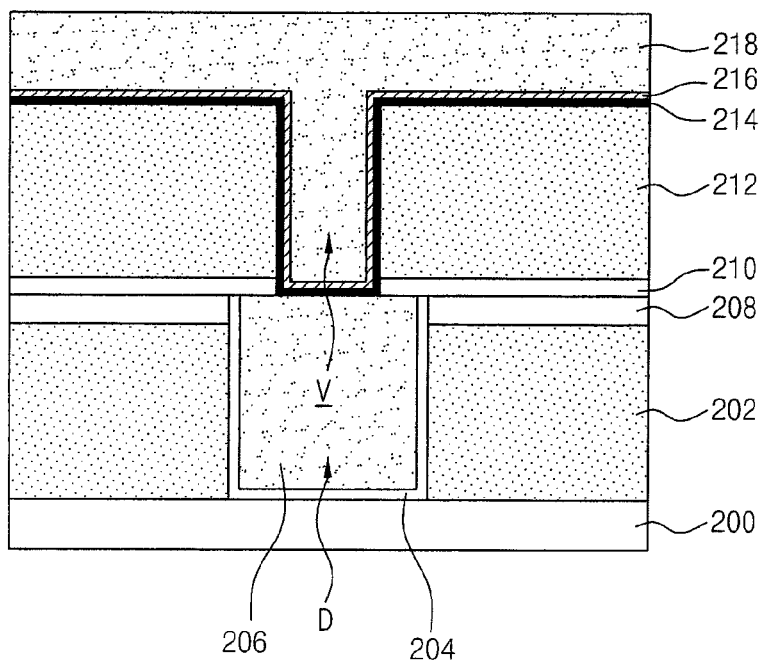

Referring to FIG. 2F, a metal layer for an upper metal line is formed to fill the second metal line forming region V on the semiconductor substrate 200 including the second metal line forming region V having the diffusion barrier 214 and the wetting layer 216. The metal layer includes an aluminum layer. An upper metal line 218 is formed by etching the metal layer for an upper metal line, the wetting layer 216, and the diffusion barrier 214. Accordingly, the manufacture of a multi-layered metal line including the lower metal line 206 and the upper metal line 218 according to the present invention is completed.

As is apparent from the above description, in the present invention, the characteristics of the diffusion barrier can be improved without increasing the thickness of the diffusion barrier in comparison with a diffusion barrier according to the conventional art since the diffusion barrier, including a W—B—N ternary layer, is formed through PVD, CVD or ALD having excellent step coverage quality.

Therefore, in the present invention, it is possible to prevent voids from being formed and a high resistance compound from being produced in a metal layer due to diffusion of metal layers. The characteristics and reliability of a semiconductor device can thereby be improved since it is possible to prevent contact resistance from increasing.

Also, in the present invention, the process for forming the upper metal line can be stably and easily implemented due to the $W_2B$ layer, having low specific resistance, is formed as a wetting layer on the diffusion barrier.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for forming a multi-layered metal line of a semiconductor device, comprising the steps of: forming, a lower metal line on a semiconductor substrate; forming an insulation layer on the semiconductor substrate including the lower metal line having an upper metal line forming region exposing at least a portion of the lower metal line; forming a diffusion barrier including a W—B—N ternary layer on the insulation layer including a surface of the upper metal line forming region, wherein the diffusion barrier is formed through atomic layer deposition using WF6, B2H6 and NH3; forming a wetting layer containing W2B on the diffusion barrier; and forming an upper metal line on the diffusion barrier to fill the upper metal line forming region.

2. The method according to claim 1, wherein the lower metal line includes a copper layer, and the upper metal line includes an aluminum layer.

3. The method according to claim 1, wherein the diffusion barrier is formed to have a thickness of 10-500 Å.

4. The method according to claim 1, wherein the wetting layer is formed through chemical vapor deposition or atomic layer deposition using $WF_6$ and $B_2H_6$ gas.

5. The method according to claim 1, wherein the wetting layer is formed as a $W_2B$ layer containing 20-40 atom % of boron.

6. The method according to claim 1, wherein the wetting layer is formed to have a thickness of 10~1,000 Å.

* * * * *